US008087203B2

(12) United States Patent  
Boesel et al.

(10) Patent No.: US 8,087,203 B2
(45) Date of Patent: Jan. 3, 2012

(54) WAVEGUIDE FOR A RADIO FREQUENCY DOOR

(75) Inventors: Matthew Boesel, Waterford, WI (US); James P. Maslowski, Wauwatosa, WI (US); Dean Molstad, Sussex, WI (US); Steve Zwicke, Sussex, WI (US)

(73) Assignee: PDC Facilities, Inc., Hartland, WI (US)

( * ) Notice: Subject to any disclaimer, the term of this patent is extended or adjusted under 35 U.S.C. 154(b) by 85 days.

(21) Appl. No.: 12/565,003

(22) Filed: Sep. 23, 2009

(65) Prior Publication Data

US 2010/0154325 A1 Jun. 24, 2010

Related U.S. Application Data

(60) Provisional application No. 61/138,799, filed on Dec. 18, 2008.

(51) Int. Cl.
*E06B 1/04* (2006.01)
(52) U.S. Cl. ........... 52/212; 52/204.1; 52/220.8; 174/64
(58) Field of Classification Search ............ 52/212, 52/211, 204.1, 220.8, 220.1; 49/504, 505; 174/50, 58, 63, 64

See application file for complete search history.

(56) References Cited

U.S. PATENT DOCUMENTS

| | | | | |
|---|---|---|---|---|
| 2,277,217 A * | 3/1942 | Faber | ................... | 52/220.1 |
| 2,742,117 A * | 4/1956 | Tolman | ................... | 49/399 |
| 3,211,824 A * | 10/1965 | Heiman | ................... | 174/507 |
| 3,211,825 A * | 10/1965 | Clos | ................... | 174/507 |
| 3,401,487 A * | 9/1968 | Brandt et al. | ................... | 49/504 |
| 3,689,681 A * | 9/1972 | Searer et al. | ................... | 174/507 |
| 3,828,113 A * | 8/1974 | Bourne | ................... | 174/55 |
| 4,112,645 A * | 9/1978 | Greenfield | ................... | 52/209 |
| 4,924,646 A * | 5/1990 | Marquardt | ................... | 52/220.1 |
| 5,287,664 A * | 2/1994 | Schiller et al. | ................... | 52/220.1 |
| 2003/0084616 A1* | 5/2003 | Kimball | ................... | 49/504 |
| 2003/0101668 A1* | 6/2003 | Monden et al. | ................... | 52/220.8 |
| 2004/0154816 A1* | 8/2004 | Rainbolt | ................... | 174/48 |
| 2008/0190053 A1* | 8/2008 | Surowiecki | ................... | 52/220.8 |
| 2010/0012791 A1* | 1/2010 | Coughlin | ................... | 248/49 |

* cited by examiner

Primary Examiner — Robert Canfield
Assistant Examiner — Babajide Demuren
(74) Attorney, Agent, or Firm — Michael Best & Friedrich LLP

(57) ABSTRACT

A waveguide for a radio frequency door like that used in a medical imaging room allows intravenous lines and electrical conduits to be inserted through the door frame without being disconnected from the patient. The waveguide includes a door frame section, and a removable, telescoping or pivoting movable member that cooperates with the door frame section to retain the conduits. The movable member is positioned away from the door frame section during insertion and removal of the conduits from the door frame section, and is positioned adjacent the door frame section when the conduits are being retained. The dimensions and materials of the waveguide are selected to achieve attenuation of electromagnetic interference.

15 Claims, 16 Drawing Sheets

WAVEGUIDE FOR A RADIO FREQUENCY DOOR

RELATED APPLICATION

This application claims priority from U.S. Provisional Patent Application No. 61/138,799 filed on Dec. 18, 2008, which is incorporated by reference herein.

BACKGROUND

The present invention relates to waveguides, and more particularly it relates to waveguides for radio frequency doors and frames.

Medical facilities, laboratories, and other facilities may have specially constructed rooms that are used for conducting procedures or operating equipment that is sensitive to environmental radio frequency interference. These rooms can be used for magnetic resonance imaging or other applications where environmental radio frequencies could impede performance of the equipment. Generally, these specially constructed rooms are designed to prevent or attenuate environmental radio frequency interference from entering or leaving the room. Environmental radio frequency interference can come from any number of sources, such as television and radio signals, power equipment, monitors, fluorescent lights, computers, other medical equipment, and the like.

Part of the specialized construction for these rooms includes special doors and door frames that are designed to prevent or attenuate environmental frequencies from entering or leaving these rooms. Typically, these types of doors and door frames do not contain any apertures or penetrations that could allow electromagnetic radiation to leak into or out of the room and are provided with a gasket positioned between the door and the door frame such that a seal is formed that prevents or attenuates radio frequency transmission from passing between the door and the door frame.

In some situations, the radio frequency door may need to be closed when a patient is inside the room. For example, the patient may require certain test procedures (e.g., magnetic resonance imaging). When the patient is ill, the patient may be connected to medical equipment, intravenous (IV) lines, or other conduits. At times, the medical equipment and supporting stations (e.g., carts, IV stands, etc.) remain outside the room during the procedure. Thus, the patient may need to be disconnected from the medical equipment, IV lines, and other conduits before the radio frequency door may be closed. This is undesirable in most cases because, for example, the medical equipment may be performing life sustaining functions or the IV lines may be providing medication to the patient.

SUMMARY

One construction of the invention provides a waveguide for an MRI (Magnetic Resonance Imaging) scan room. The waveguide includes a door frame section and a movable member configured to be disposed in a first position in which the movable member cooperates with the door frame section to retain the conduit. The movable member is also configured to be disposed in a second position sufficiently spaced from the door frame section so that the conduit may be at least one of placed adjacent to the door frame section and removed from the waveguide.

The movable member be pivotable attached to the door frame section, so that it is swung away from the door frame section when the conduit is being inserted or removed from the waveguide, but is positioned in a slot in the door frame section when the conduits are retained in one or more recesses in the waveguide. Alternatively, the movable member may be attached by one or more telescoping members configured to retract into or extend from the door frame section. The movable member may also be a movable block connected to the door frame section by a tether. The block is moved away from the door frame section before the insertion or removal of the conduit, and is place adjacent the door frame section to retain the conduit during a medical imaging procedure.

Other aspects of the invention will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

Figure 1:
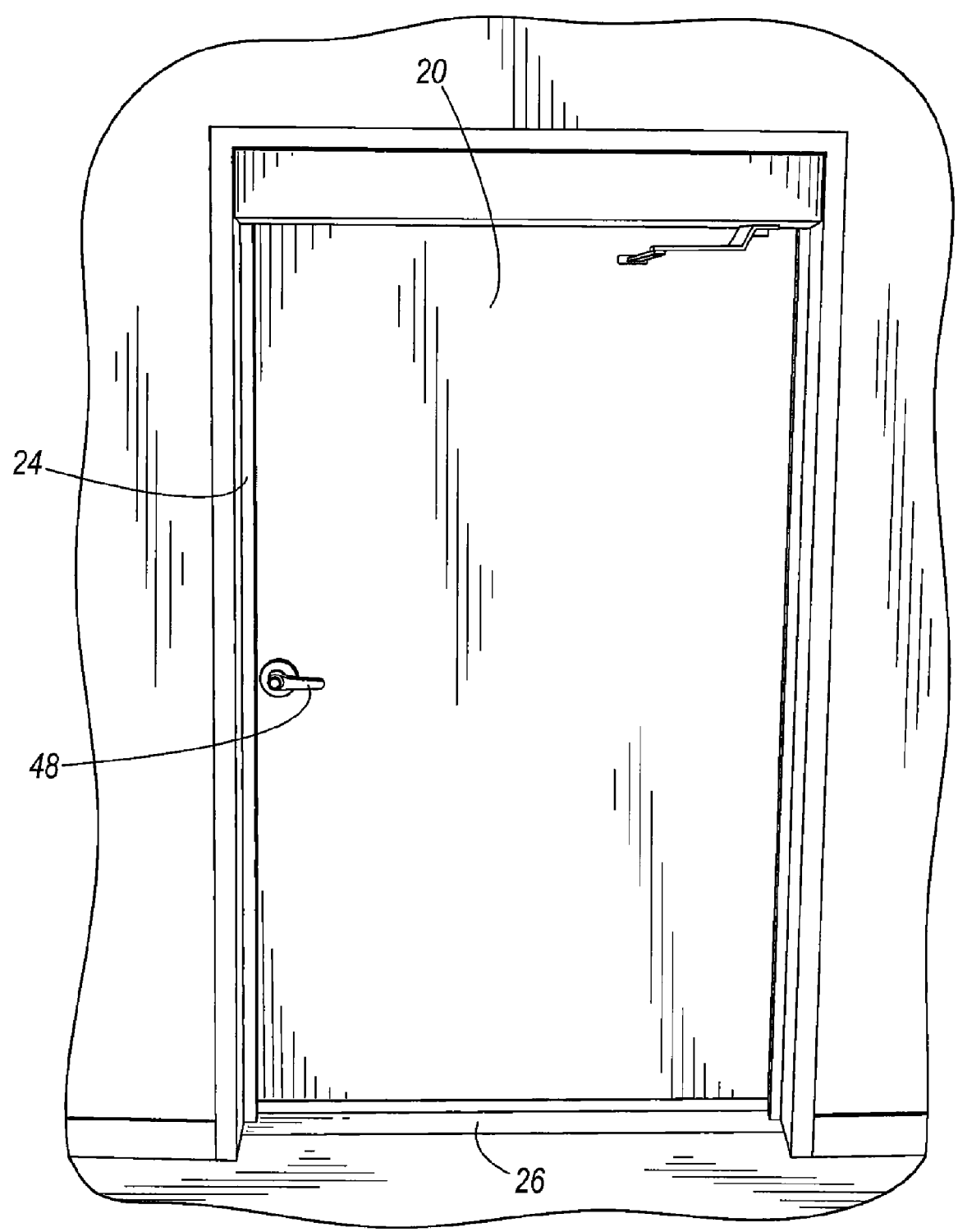
FIG. 1 is a perspective view of a frame and a radio frequency (RF) door illustrating possible locations of a waveguide according to the present invention.

FIG. 1 illustrates possible locations in a radio frequency (RF) door 20 and frame 24 for a waveguide 28, 32, 36, 40, 44, 112, 120 (FIGS. 2-10) according to the present invention. The RF door 20 and frame 24 are constructed of materials that minimize the passage or transmission of radio waves through the door 20 and the frame 24. For example, the RF door 20 and frame 24 may be constructed from a metal alloy, aluminum or other non-ferrous materials, steel or other ferrous materials, and the like.

The door 20 is connected to the frame 24 by one or more hinges (not shown). Accordingly, the door 20 can be moved through a variety of positions with respect to the frame 24 to selectively allow passage through the door frame 24. For example, the door 20 can be positioned in a variety open positions with respect to the door frame 24, where varying levels of electromagnetic interference can pass between the door 20 and the frame 24. The door 20 also has a closed position where the passage of electromagnetic interference of 0-150 MHz between the door 20 and the door frame 24 is substantially prevented or highly attenuated. In other constructions, frequencies in the range of 0-750 MHz may be substantially prevented or highly attenuated. Of course, the range may be extended to include higher frequencies to reflect advances in MRI technology.

The frame 24 is positioned to surround four sides of the door 20 when the door 20 is in the closed position and includes a threshold 26 of the door 20. The frame 24 further includes a strike plate (not shown) that directly opposes a latch (not shown) and door handle 48 when the RF door 20 is in the closed position. The strike plate may be part of a door closing mechanism. An example of a door closing mechanism including a retractable latch and strike plate that may be used in combination with the present invention is described in U.S. Pat. No. 7,448,165, issued Nov. 11, 2008, which is incorporated herein by reference.

As shown in FIG. 1, the waveguide 28, 32, 36, 40, 44, 112, 120 (FIGS. 2-10) may be positioned anywhere along the door frame 24. In preferred constructions, the waveguide 28, 32, 36, 40, 44, 112 is positioned anywhere along the strike side of the door frame 24. The waveguide 28, 32, 36, 40, 44, 112, 120 allows at least one conduit 52 (see FIG. 5) to pass through at least one of the door 20 and the frame 24 while still attenuating or substantially preventing the passage of electromagnetic radiation of 0-150 MHz into or out of the room. The conduit 52 may be an intravenous (IV) line, tube, cable, etc. and may be attached to a patient. The conduit 52 should be composed of non-conductive materials. The waveguide 28, 32, 36, 40, 44, 112, 120 may be positioned along the strike side of the door frame 24 in a position that is easily accessible to medical personnel and does not cause undo stress on the conduit 52 when positioned in the waveguide 28, 36, 40, 44. For example, the waveguide 28, 36, 40, 44, 112, 120 may be located slightly below the strike plate such that is it approximately at the waist level of a normal person. In other constructions, the waveguide 28, 32, 36, 40, 44, 112, 120 may be positioned along the threshold 26 of the door frame 24 or a different side of the door frame 24.

Figure 2:
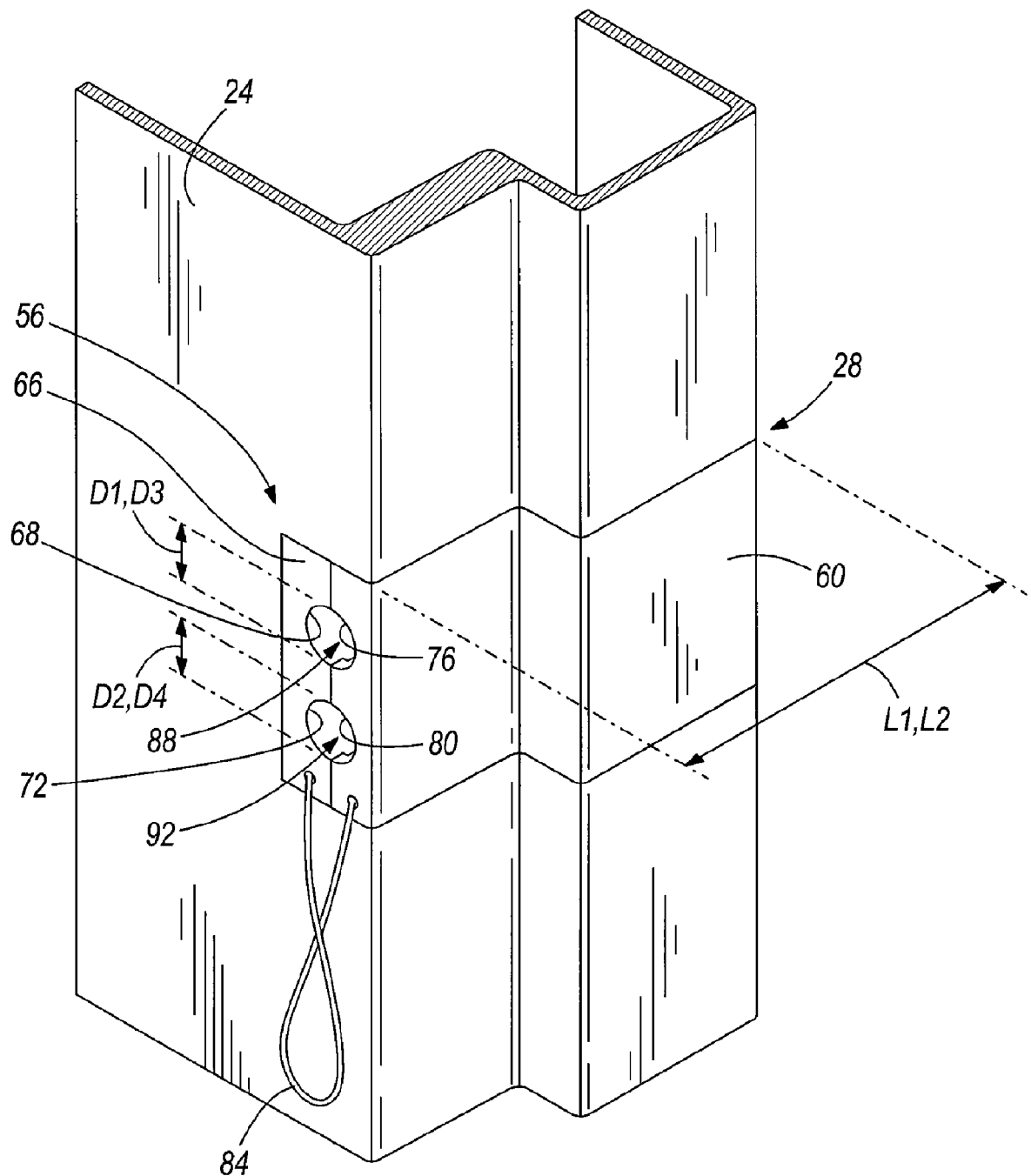
FIG. 2 is a perspective view of a waveguide according to the present invention that includes a door frame section and a movable member positioned adjacent the door frame section.
Figure 3:
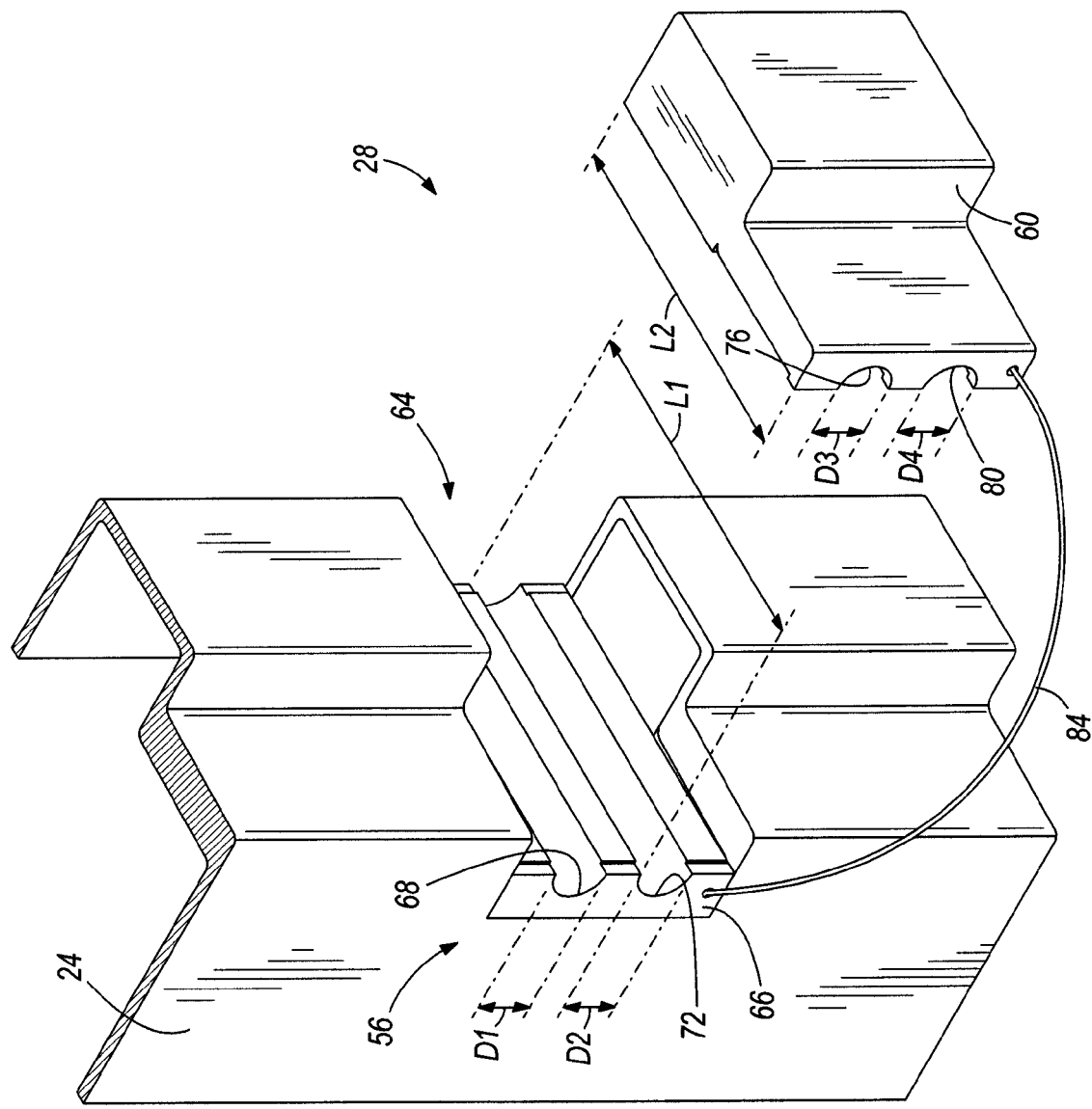
FIG. 3 is a perspective view of the waveguide of FIG. 2, with the movable member spaced from the door frame section.

As illustrated in FIGS. 2 and 3, one construction of the waveguide 28 includes a door frame section 56 and a movable member 60. The door frame section 56 may be formed as a separate piece from the door frame 24. The door frame section 56 includes a slot 64 (see FIG. 3) into which an insert 66 may be permanently attached by welding, adhesive, fasteners, etc. Alternatively, insert 66 could be eliminated so that recesses 68, 72 are formed in the frame 24. The door frame section 56 includes first and second semi-cylindrically shaped recesses 68 and 72. The first and second recesses 68, 72 each have a length L1 that is approximately equal to the thickness of the door frame section 56. The first recess 68 has a maximum depth D1, and the second recess 72 has a maximum depth D2. In other constructions, the door frame section 56 may contain no recesses or a different number of recesses. If the door frame section 56 does not have a recess, then movable member 60 should have a recess. Of course, in other constructions, the recesses may be shaped or oriented differently.

In FIG. 2, the movable member 60 is positioned within the slot 64 in the door frame section 56 such that it is positioned adjacent to insert 66. In FIG. 3, the movable member 60 is spaced from the door frame section 56. The movable member 60 is shaped such that the contour of the door frame section 56 is substantially the same when the movable member 60 is positioned adjacent the door frame section 56 as the adjacent surfaces of the door frame.

The movable member 60 includes third and fourth semi-cylindrically shaped recesses 76 and 80. The third and fourth recesses 76, 80 each have a length L2 that is approximately equal to the length of the movable member. The third recess 76 has a maximum depth D3, and the fourth recess 80 has a maximum depth D4. In other constructions, the movable member 60 may contain no recesses or may contain a different number of recesses. If the movable member 60 does not have a recess, then door frame section 56 should have a recess. Of course, in other constructions, the recesses may be shaped or oriented differently.

A tether 84 contains two ends. One end is attached to the door frame section 56 and the other end is attached to the movable member 60. When the movable member 60 is spaced from the door frame section 56, as shown in FIG. 3, the tether 84 will prevent the movable member 60 from being lost or misplaced. The tether 84 is attached near the lower portions of the door frame section 56 and the movable member 60 so it does not interfere with the waveguide 28 when a user positions a conduit 52 therein.

The first recess 68 and the third recess 76 are formed in the door frame section 56 and the movable member 60, respectively, such that they oppose each other and form a first conduit retainer 88 when the movable member 60 is positioned adjacent the door frame section 56. Similarly, the second recess 72 and fourth recess 80 oppose each other and form a second conduit retainer 92 when the movable member 60 is positioned adjacent the door frame section 56. In other constructions, the waveguide 28 may contain a different number of conduit retainers or may contain differently shaped conduit retainers. For example, a semi-cylindrically shaped recess may be present in the movable member 60 but not in the door frame section 56. When the movable member 60 is positioned adjacent the door frame section 56, the recess will cooperate with the door frame section 56 to form a semi-cylindrical conduit retainer rather than a cylindrical conduit retainer as described above. If opposing recesses contain rectangular recesses, a rectangular conduit retainer may be formed when the movable member 60 is positioned adjacent the door frame section 56.

The first and second conduit retainers 88, 92 shown in FIGS. 2 and 3 are substantially cylindrical and have lengths L1, L2 that are equal to the lengths L1, L2 of the door frame section 56 and the movable member 60. The first conduit retainer 88 has a maximum depth D1 that is equal to the maximum depths D1, D3 of the first recess 68 and the third recess 76, and the second conduit retainer 92 has a maximum depth D2 that is equal to the maximum depths D2, D4 of the second recess 72 and the fourth recess 80. The depths D1, D2 are sized to accommodate at least one conduit 52 therein. The lengths L1, L2 of the first and second conduit retainers 88, 92 are each at least four times greater than the depths D1, D2 such that radio frequency emissions between 0-150 MHz are substantially attenuated and prevented from passing into or out of the room. The length of a hollow tube (e.g., conduit retainer) should be at least three times greater than the diameter to attenuate radio frequency emissions between 0-150 MHz (see Brewer, Ron, "Shielding: A Look at Waveguide Penetrations," *EE Evaluation Engineering*, January 2001).

Of course, waveguides are not limited to the attenuation of frequencies in a specific range. Equations 1-3 (see Brewer) may be used to calculate the attenuation per unit length $A_{UL}$ in decibels per inch (dB/in.) for a given frequency F. Equation 2 is used to calculate the cut-off frequency $F_{CO}$ if the cross-sectional shape of the waveguide is rectangular with width W in inches, and Equation 3 is used to calculate the cut-off frequency $F_{CO}$ if the cross-sectional shape of the waveguide is circular with diameter D in inches. Of course equations may also be derived for calculating the cut-off frequency of other shapes of waveguides.

$$A_{UL}(\text{dB/in.}) = 0.00463F\sqrt{\left(\frac{F_{CO}}{F}\right)^2 - 1} \qquad \text{EQ. 1}$$

$$F_{CO}(\text{MHz}) = \frac{5900 \text{ in./}\mu s}{W} \qquad \text{EQ. 2}$$

$$F_{CO}(\text{MHz}) = \frac{6290 \text{ in./}\mu s}{D} \qquad \text{EQ. 3}$$

It is preferable for the length of the conduit retainer to be at least four times greater than the maximum depth because the 4:1 ratio will provide over 120 dB attenuation for frequencies up to approximately 9 GHz (see Brewer). In this way, a hole can be introduced in an RF shield without substantially comprising its ability to shield RF transmissions. In some constructions, the depths D1, D2 are equal to 0.75 inches and the lengths L1, L2 are equal to 4.5 inches.

Figure 4:
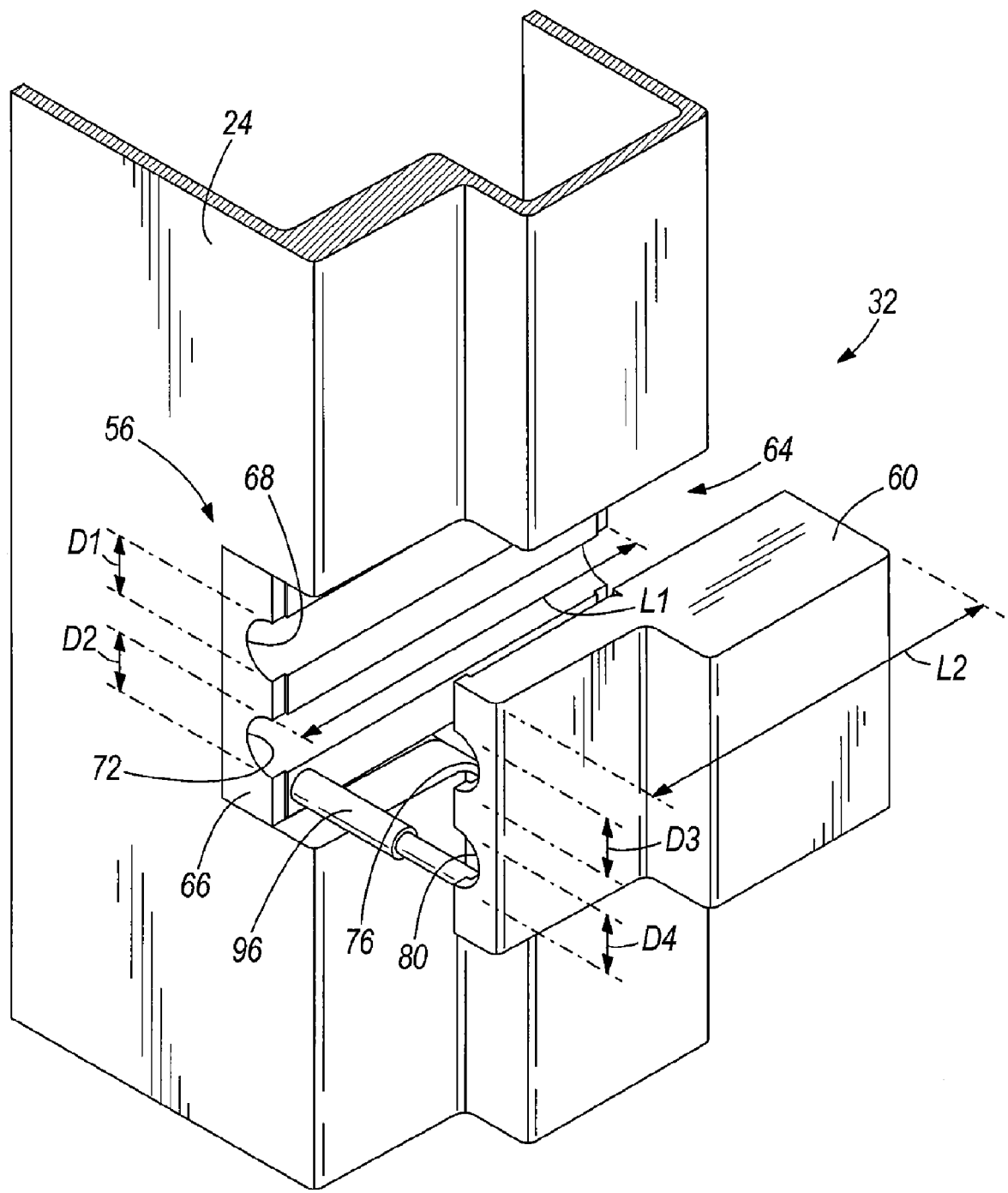
FIG. 4 is a perspective view of a second construction of a waveguide according to the present invention that includes a telescoping member, with the movable member spaced from the door frame section.

FIG. 4 illustrates a second construction of a waveguide 32 in accordance with the present invention. The waveguide 32 is similar to the waveguide 28 of FIGS. 2 and 3 except the waveguide 32 contains a telescoping member 96 instead of a tether 84. The telescoping member 96 may be coupled to the door frame section 56 and the movable member 60 in any reasonable manner (e.g., fasteners, adhesive, welding, etc.). The telescoping member 96 is positioned such that it does not interfere with the first and second conduit retainers 68, 88. The telescoping member 96 is configured to alternately retract into and extend from the door frame section 56 to position the movable member 60 adjacent to or spaced from the door frame section 56. The telescoping member 96 is positioned near the lower edge of the waveguide 32 such that the conduits 52 (FIG. 5) may be positioned in the recesses 68, 72, 76, 80 from the top. In other constructions, the telescoping member 96 may be positioned at different heights or at different positions along the length of the waveguide 32.

Figure 5:
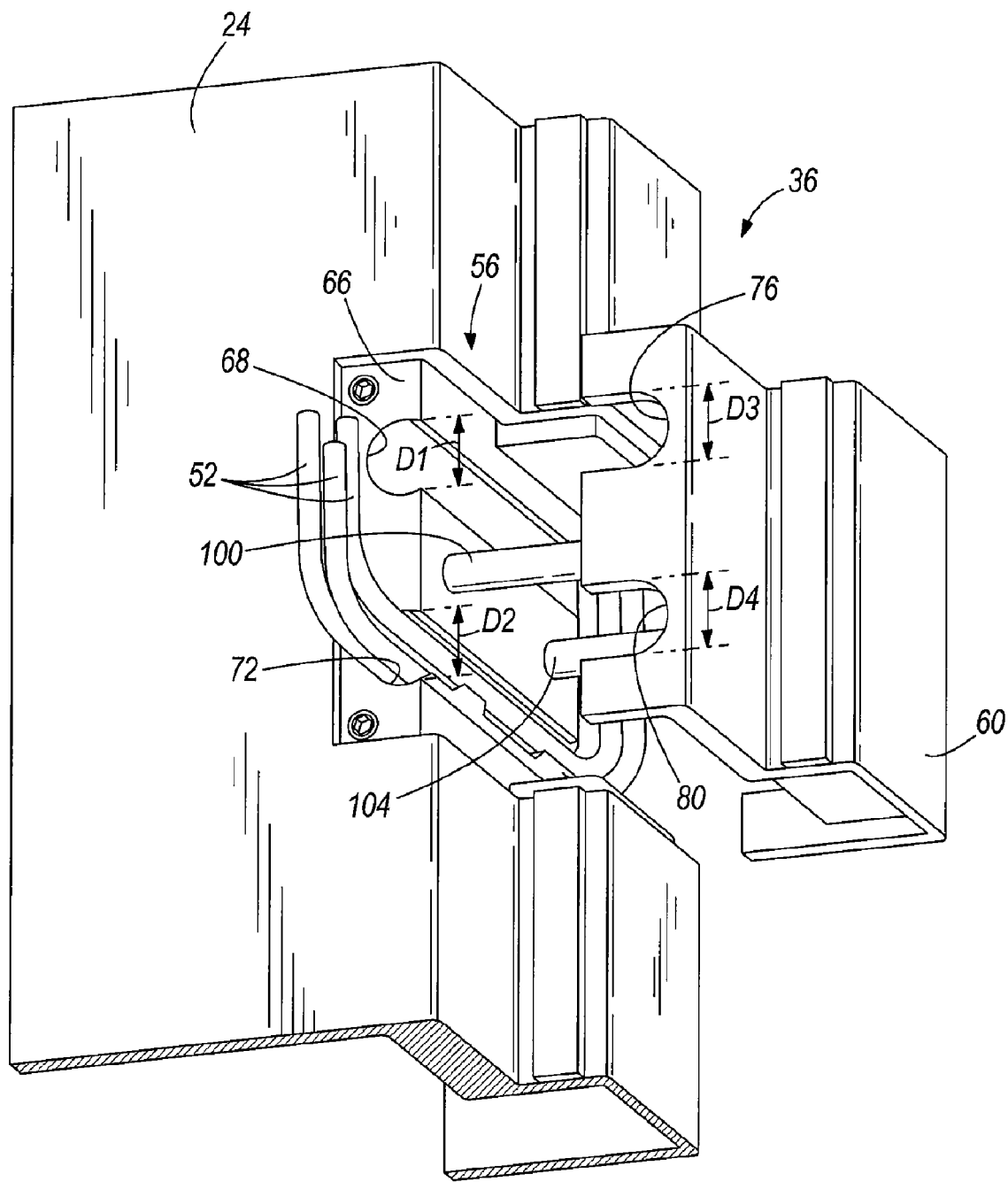
FIG. 5 is a perspective view of a third construction of a waveguide according to the present invention that includes two telescoping members, with the movable member spaced from the door frame section.

FIG. 5 illustrates a third construction of a waveguide 36 in accordance with the present invention. The waveguide is similar to the waveguide of FIGS. 2-4 except the waveguide 36 includes two telescoping members 100, 104. The telescoping members 100, 104 may be coupled to the door frame section 56 and the movable member 60 in any reasonable manner (e.g., fasteners, adhesive, welding, etc.). The first and second telescoping members 100, 104 are positioned at a height between first and third recesses 68, 76 and the second and fourth recesses 72, 80. The telescoping members 100, 104 are spaced along the length of the waveguide 36. Similar to the telescoping member 96 of FIG. 4, the first and second telescoping members 100, 104 are configured to alternately retract into and extend from the door frame section 56 to position the movable member 60 adjacent to or spaced from the door frame section 56. The conduits 52 are placed in the first conduit retainer 68 from the top and in the second conduit retainer 92 from the bottom. In other constructions, the first and second telescoping members 100, 104 may be positioned differently with respect to the waveguide 36.

Figure 8:
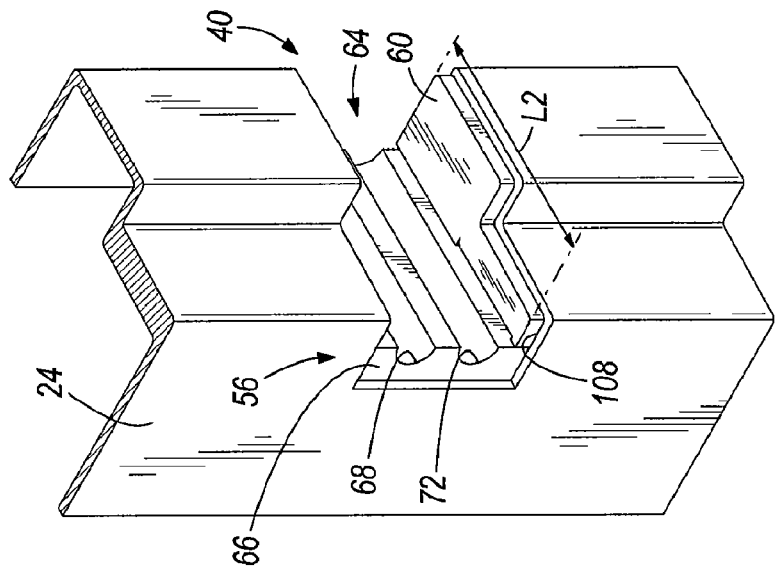
FIG. 8 is a perspective view of the waveguide of FIG. 6, with the movable member spaced from the door frame section and positioned substantially within the cavity in the door frame section.
Figure 7:
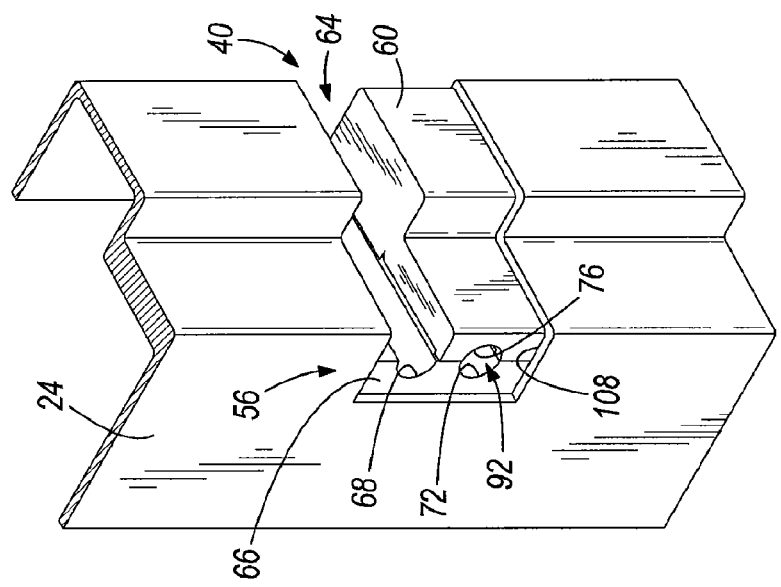
FIG. 7 is a perspective view of the waveguide of FIG. 6, with the movable member positioned partially within a cavity in the door frame section.
Figure 6:
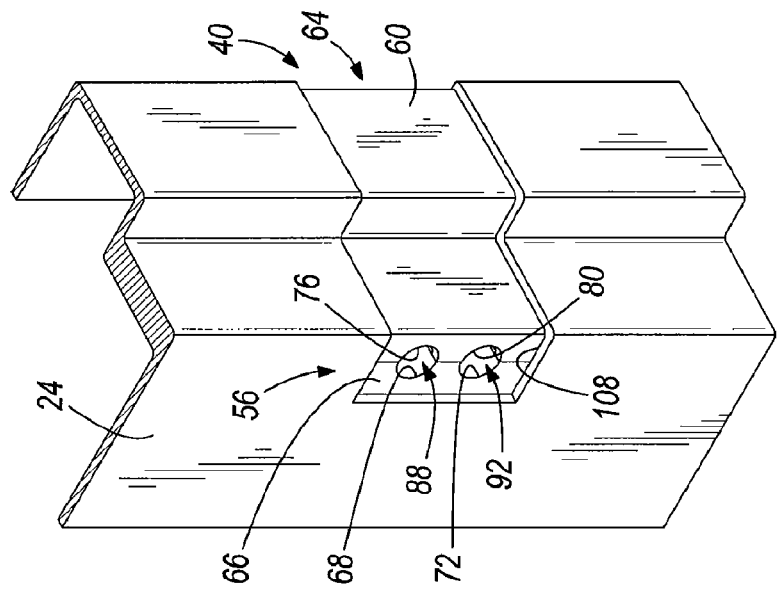
FIG. 6 is a perspective view of a fourth construction of a waveguide according to the present invention that includes a sliding mechanism, with the movable member positioned adjacent the door frame section.

FIGS. 6-8 illustrate a fourth construction of a waveguide 40 in accordance with the present invention. The waveguide 40 is similar to the waveguide of FIGS. 2-5 except it includes a sliding mechanism that allows the movable member 60 to slide into and out of a cavity 108 formed in the door frame 24. The sliding mechanism may include a track coupled to the frame 24 and rollers coupled to the movable member 60 such that the rollers roll along the track as the waveguide 40 is moved into and out of the cavity 108. In use, the user slides the movable member 60 downward into the cavity 108 in the door frame 24 to open the first and second conduit retainers 88, 92. When the first and second recesses 68, 72 are unopposed by the third and fourth recesses 76, 80, the first and second conduit retainers 68, 92 are open, and the conduits 52 may be positioned in one or both of the first and second recesses 68, 72. The movable member 60 may be slid upward, back to the fully closed position, as shown in FIG. 6, to close the conduit retainers 88, 92 and retain the conduits 52 therein.

In other constructions, the sliding mechanism may operate in a different manner. For example, the movable member 60 may be spaced from the door frame member 56 by sliding the movable member 60 in a direction that is not vertical. For example, the sliding mechanism may include a cam and track that cooperate to allow the movable member to be spaced away from the door frame section 56.

Figure 9:
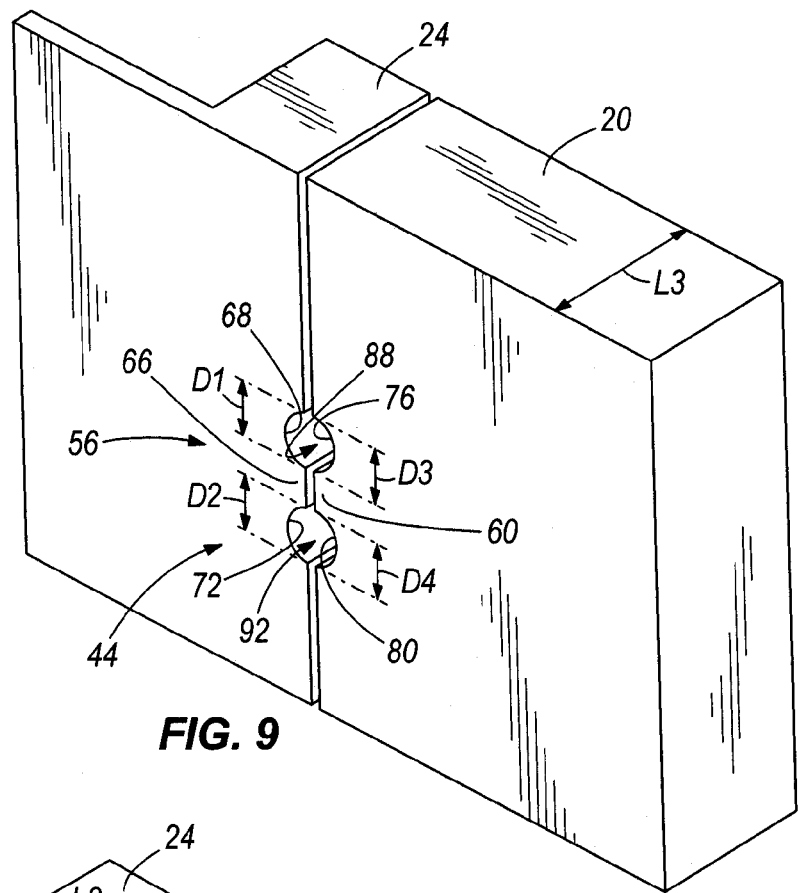
FIG. 9 is a perspective view of a fifth construction of a waveguide according to the present invention that includes a door frame section formed integrally as one piece with the frame and a movable member formed integrally as one piece with the door.
Figure 10:
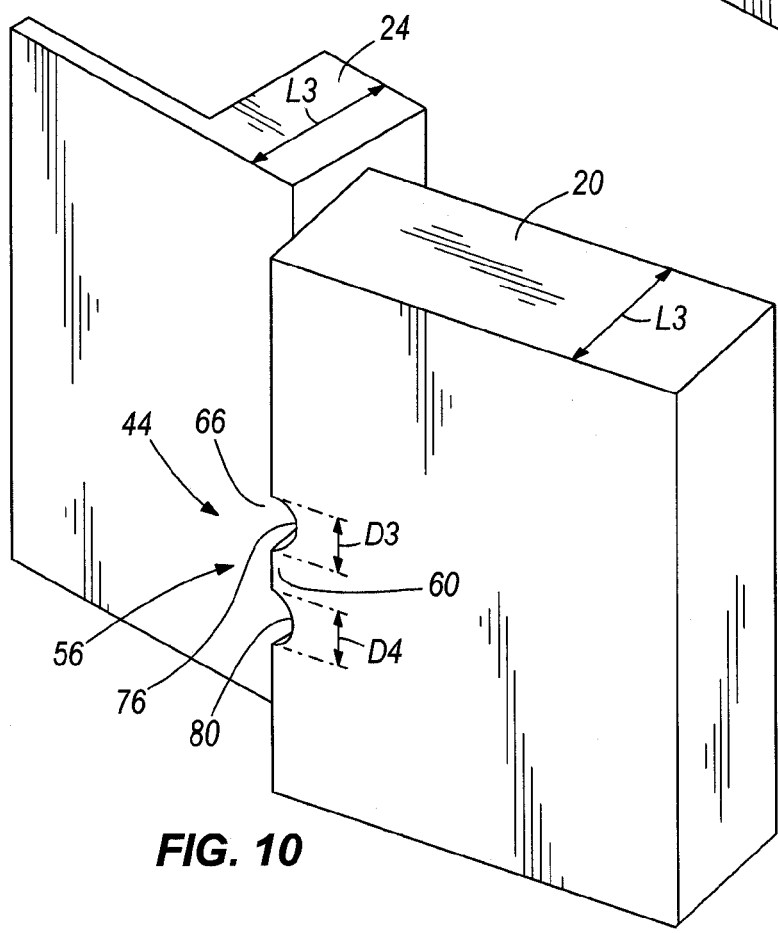
FIG. 10 is a perspective view of the waveguide of FIG. 9, with the movable member spaced from the door frame section.

FIGS. 9 and 10 illustrate a fifth construction of a waveguide 44 in accordance with the present invention. The waveguide 44 contains a door frame section 56 that is formed integrally as one piece with the door frame 24, and a movable member 60 that is formed integrally as one piece with the door 20. First and second recesses 68, 72 are formed in the frame 24, and third and fourth recesses 76, 80 are formed in the door 20. The recesses 68, 72, 76, 80 are formed such that the first and third recesses 68, 76 oppose each other when the door is in a closed position (FIG. 9) to form a first conduit retainer 68. Similarly, the second and fourth recesses 72, 80 oppose each other when the door is in the closed position (FIG. 9) to form a second conduit retainer 92. Similar to the waveguides of FIGS. 2-8, the length L3 of each of the first and second conduit retainers 88, 92 is at least four times greater than the maximum depth D1, D2 of each of the first and second conduit retainers 88, 92.

When the door 20 is in an open position (FIG. 10), the first and second recesses 68, 72 do not directly oppose the third and fourth recesses 72, 80. Thus, when the door is in the open position, the first and second conduit retainers 88, 92 are open and a conduit 52 may be positioned in one of the recesses 68, 72, 76, 80. Once the conduit 52 is placed in one of the recesses 68, 72, 76, 80, the door 20 may be closed to retain the conduit 52 in one of the conduit retainers 88, 92. In other constructions, a different number of recesses may be formed in the door 20 or the frame 24. Of course, the recesses may be differently shaped, sized, or positioned.

Figure 11:
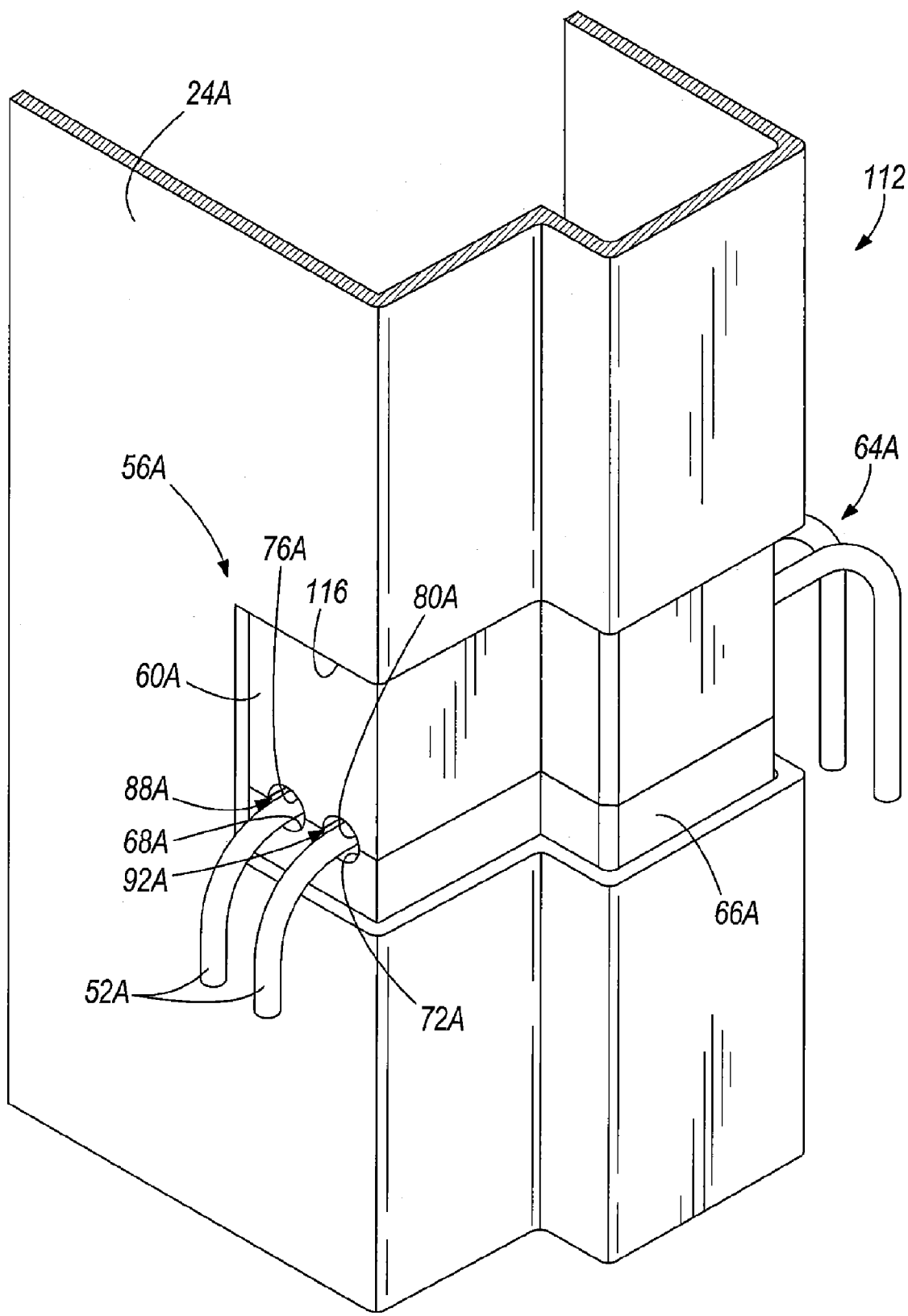
FIG. 11 is a perspective view of a sixth construction of a waveguide according to the present invention that includes a sliding mechanism similar to the sliding mechanism of FIGS. 6-8, with the movable member positioned adjacent the door frame section.
Figure 12:
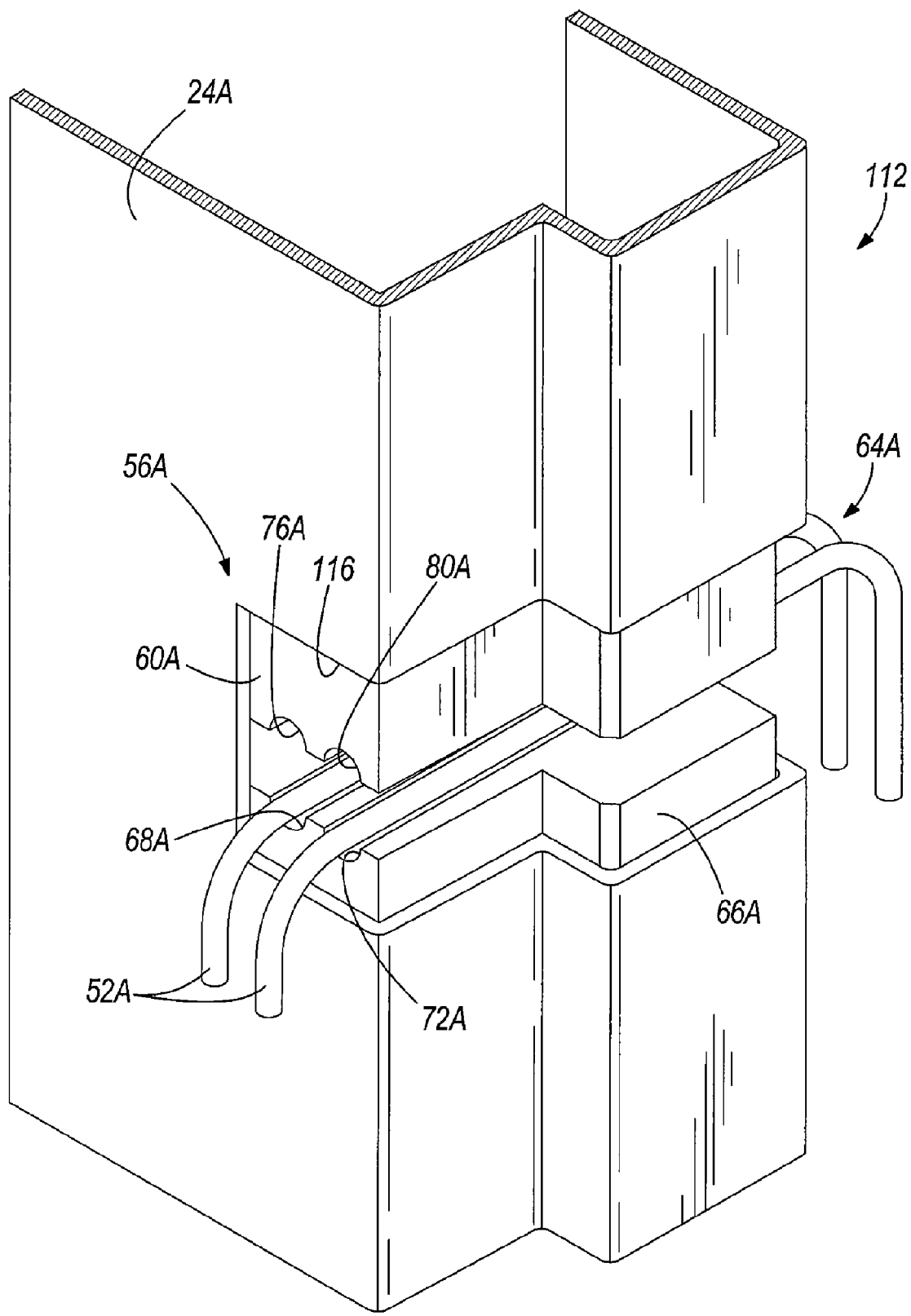
FIG. 12 is a perspective view of the waveguide of FIG. 11, with the movable member positioned partially within a cavity in the door frame section.
Figure 13:
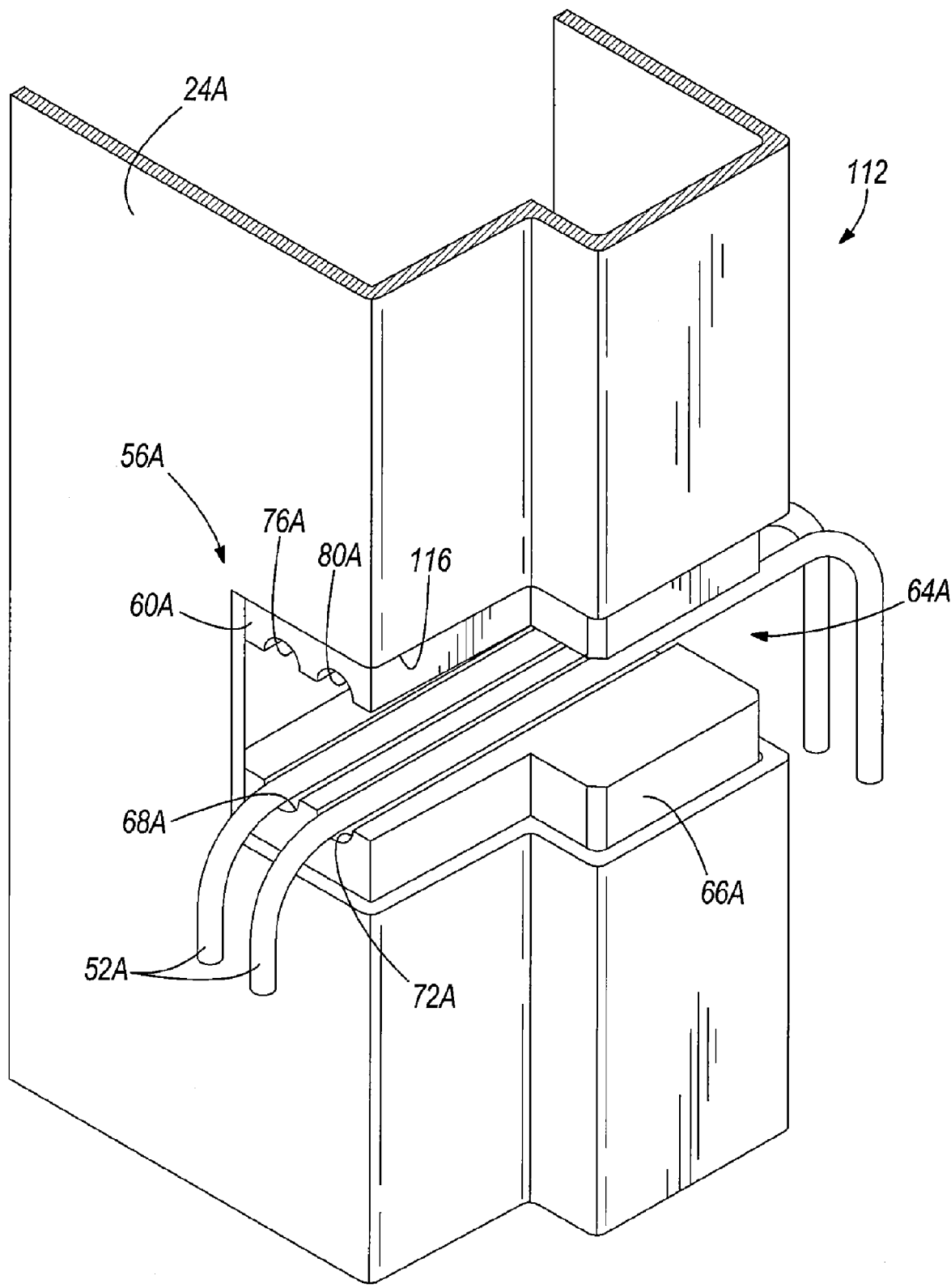
FIG. 13 is a perspective view of the waveguide of FIG. 11, with the movable member spaced from the door frame section and positioned substantially within the cavity in the door frame section.

FIGS. 11-13 illustrate a sixth construction of a waveguide 112 in accordance with the present invention. The waveguide 112 is similar to the waveguide of FIGS. 2-8 except the insert 66A and movable member 60A are oriented differently within the slot 64A formed in the door frame section 56A. The insert 66A may be permanently attached to door frame section 56A such that the insert 66A is positioned below the movable member 60A and the first and second recesses 68A, 72A face upward toward the movable member 60A. The movable member 60A is positioned in the slot 64A above the insert 66A and is oriented such that the third and fourth recesses 76A, 80A face downward toward the first and second recesses 68A, 72A, respectively.

The waveguide 112 includes a sliding mechanism similar to the sliding mechanism of waveguide 40 that allows the movable member 60A to slide into and out of a cavity 116 formed in the door frame 24A. The sliding mechanism may include a track coupled to the frame and rollers coupled to the movable member such that the rollers roll along the track as the movable member 60A is moved into and out of the cavity. In use, the user slides the movable member 60A upward into the cavity 116 (FIGS. 12 and 13) to open the first and second conduit retainers 88A, 92A (FIG. 11). The conduits 52 may be placed in the first and second recesses 68A, 72A, and the movable member 60A may be slid downward, back to the fully closed position (FIG. 11) to close the conduit retainers 88A, 92A and retain the conduits 52 therein.

Figure 14:
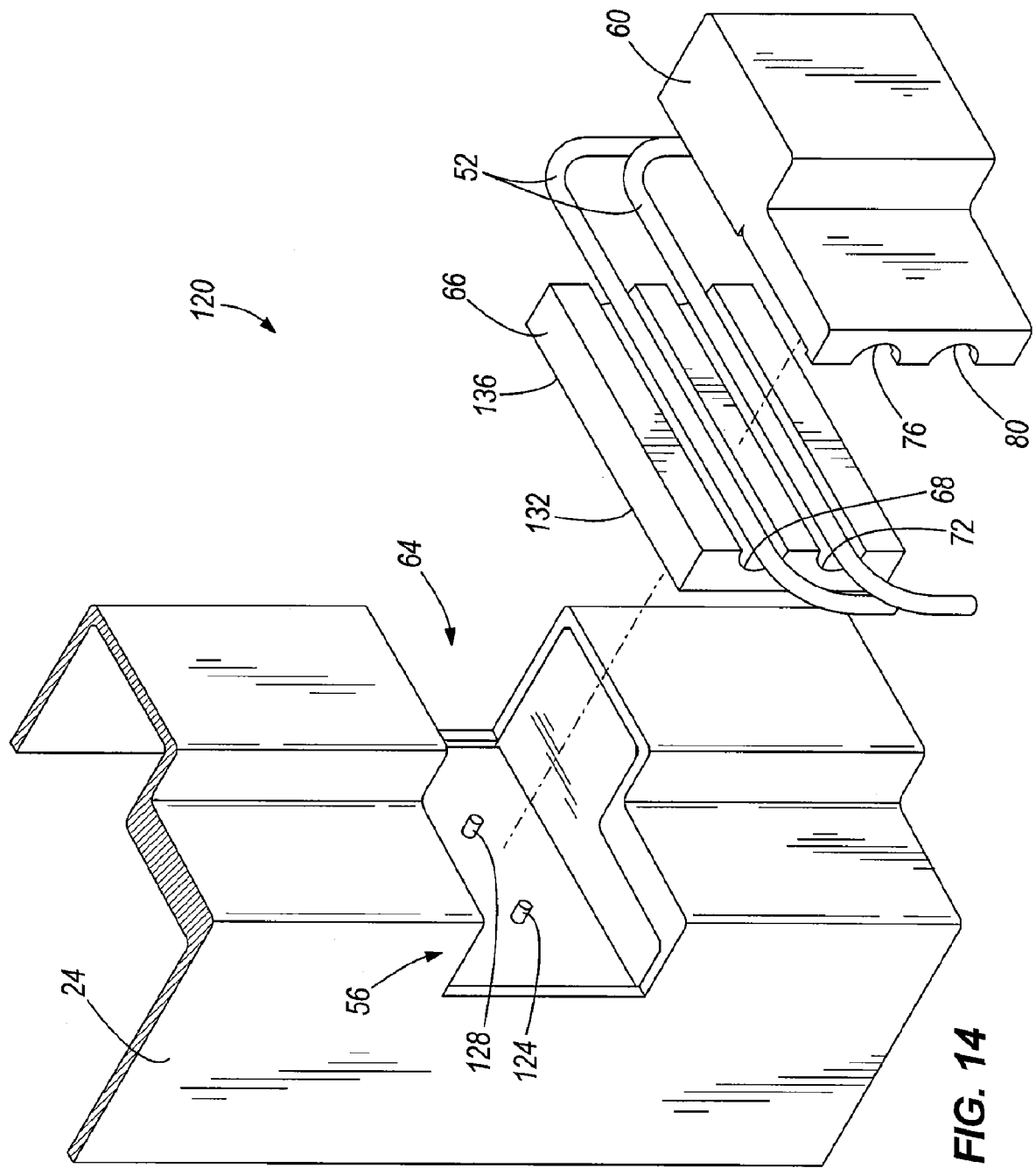
FIG. 14 is a perspective view of a seventh construction of a waveguide according to the present invention similar to the waveguide of FIGS. 2 and 3, with the insert and movable member spaced from the door frame section.
Figure 16:
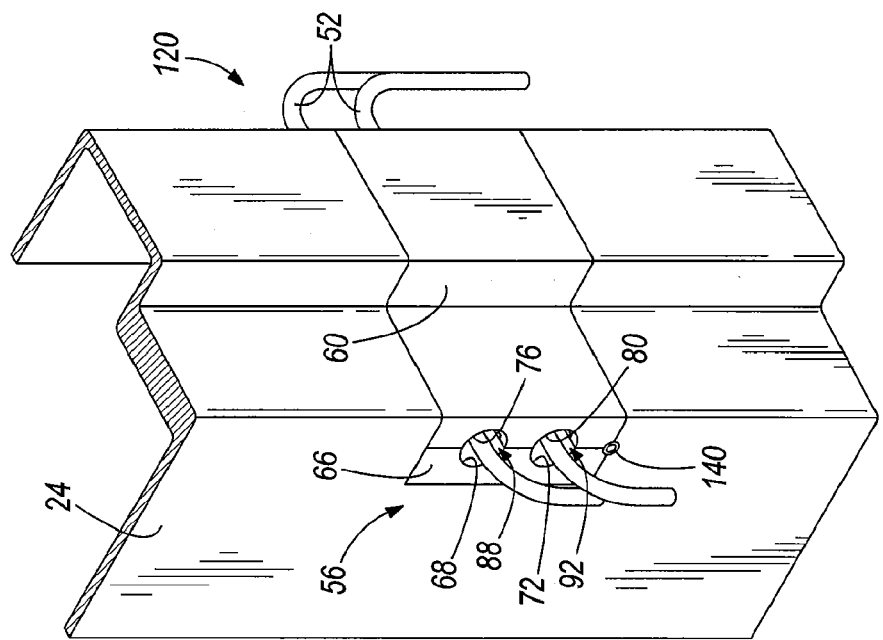
FIG. 16 is a perspective view of the waveguide of FIG. 14, with the insert and movable member positioned adjacent the door frame section.
Figure 15:
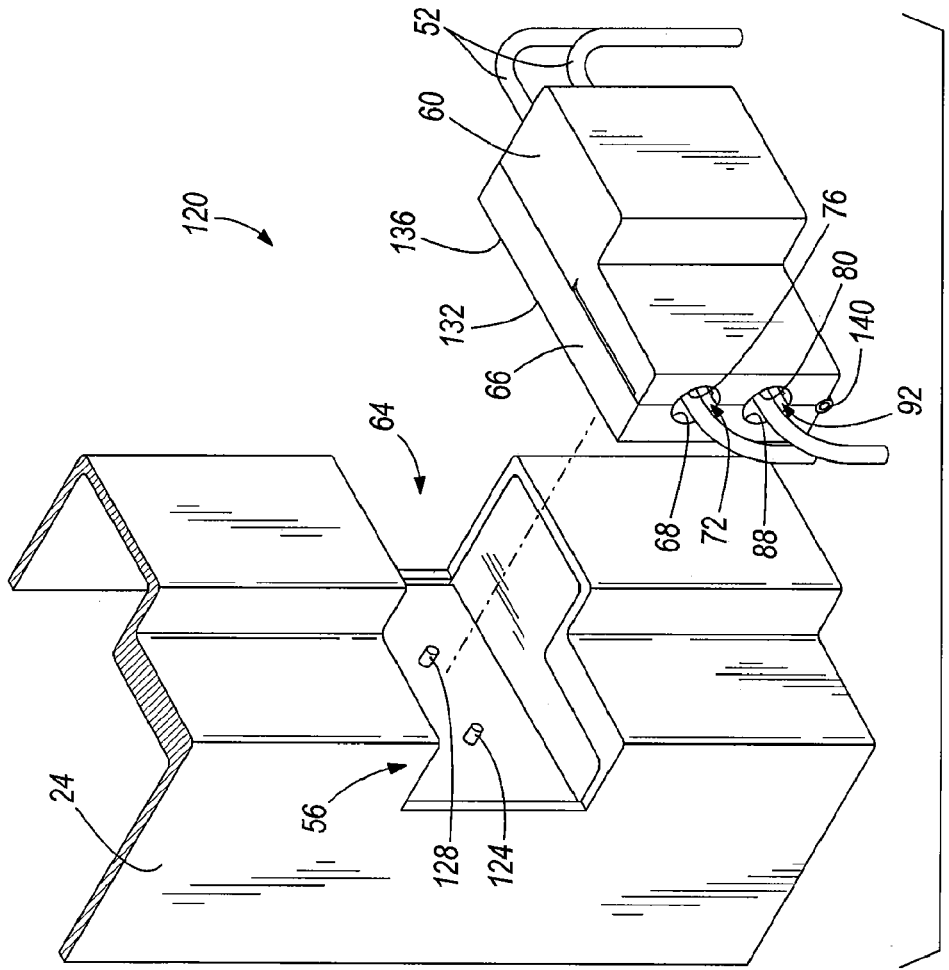
FIG. 15 is a perspective view of the waveguide of FIG. 14, with the insert and movable member spaced from the door frame section.

FIGS. 14-16 illustrate a seventh construction of a waveguide 120 in accordance with the present invention. The waveguide 120 is similar to the waveguide 28 of FIGS. 2 and 3 except the insert 66 is removable from the door frame section 56. In use, the insert 66 and movable member 60 are removed from the slot 64 and are spaced apart from each other. Conduits 52 may be placed in the first and second recesses 68, 72. The movable member 60 may be positioned adjacent the insert 66 to close the conduit retainers 88, 92 and retain the conduits 52 therein (FIG. 15). The user may adjust the position of the conduits 52 within the conduit retainers 88, 92 by sliding the insert 66 and movable member 60 together as one unit with respect to the conduits 52 to ensure the conduits 52 are not crimped and may move freely within the conduit retainers 88, 92. The insert 66, movable member 60, and conduits 52 may be positioned in the slot 64 of the door frame section 56, as shown in FIG. 16.

The waveguide 120 includes optional positioning pins 124, 128 (FIGS. 14 and 15) that are received in respective apertures 132, 136 in the insert 66 to guide the insert 66 into position in the slot 64. The insert 66 and movable member 60 include an optional hinge 140 (FIGS. 15 and 16) that allows the movable member 60 to pivot with respect to the insert 66 for opening and closing the conduit retainers 88, 92. In other constructions, the waveguide may have a different positioning device to aid in the alignment and insertion of the insert 66 and movable member 60 into the slot 64 or the waveguide may not include a positioning device. In other constructions, the waveguide may not include a hinge or may include a tether, telescoping member, or the like. In yet other constructions, at least one of the insert 66 and movable member 60 may be connected to the door frame section 56 with a tether, telescoping member, or the like.

In other constructions, a waveguide similar to waveguides 28, 32, 36, 40, or 44 may be located in the RF door 20. For simplicity, a waveguide similar to waveguide 28 of FIGS. 2 and 3 will be exemplified. The door frame section would be replaced by a corresponding door section to reflect that it is positioned in the door rather than the frame but is otherwise substantially the same except for its location. The door could contain a door section having a slot similar to the slot 64 of FIGS. 2 and 3. A movable member similar to movable member 60 may be received in the slot to be positioned adjacent the door section in a similar manner like the movable member 60 of FIGS. 2 and 3 is received in the slot 64 to be positioned adjacent the door frame section 56. The movable member 60 may be spaced from the door section in a similar manner as described for each of the embodiments described above.

In other constructions, the movable member 60 may be coupled to the door frame section 56 using alternative components. For example, the movable member 60 may be attached to the door frame 24 by a hinge such that the movable member 60 is operable to pivot from a first position, in which the movable member 60 is positioned adjacent the door frame member, to a second position, in which the movable member 60 is spaced from the door frame member.

Figure 17:
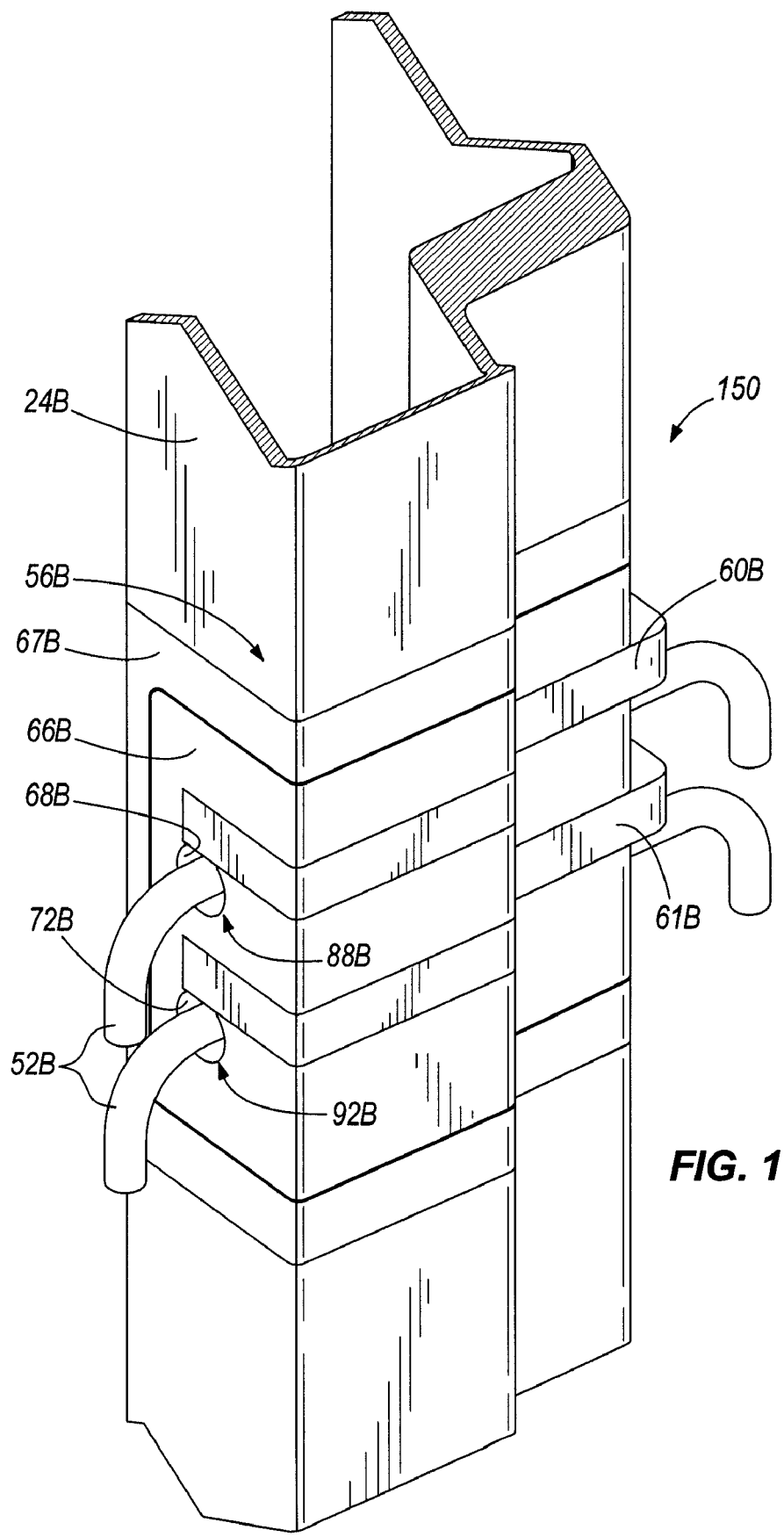
FIG. 17 is a perspective view of an eighth construction of a waveguide for a right hand door, having two pivotable movable members positioned adjacent the door frame section.
Figure 18:
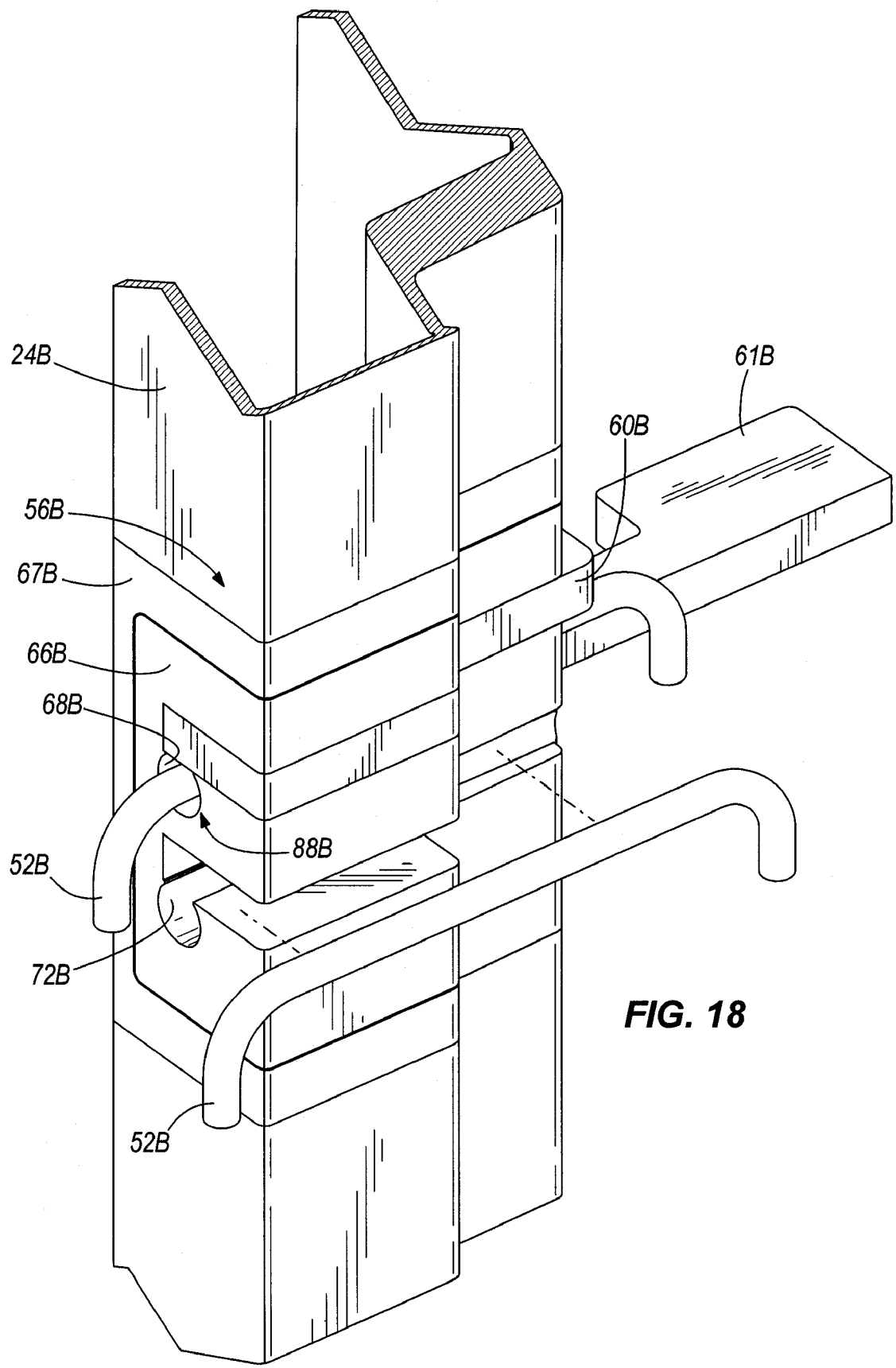
FIG. 18 is a perspective view of the waveguide of FIG. 17, depicting one of the pivotable movable members spaced from the door frame section.
Figure 19:
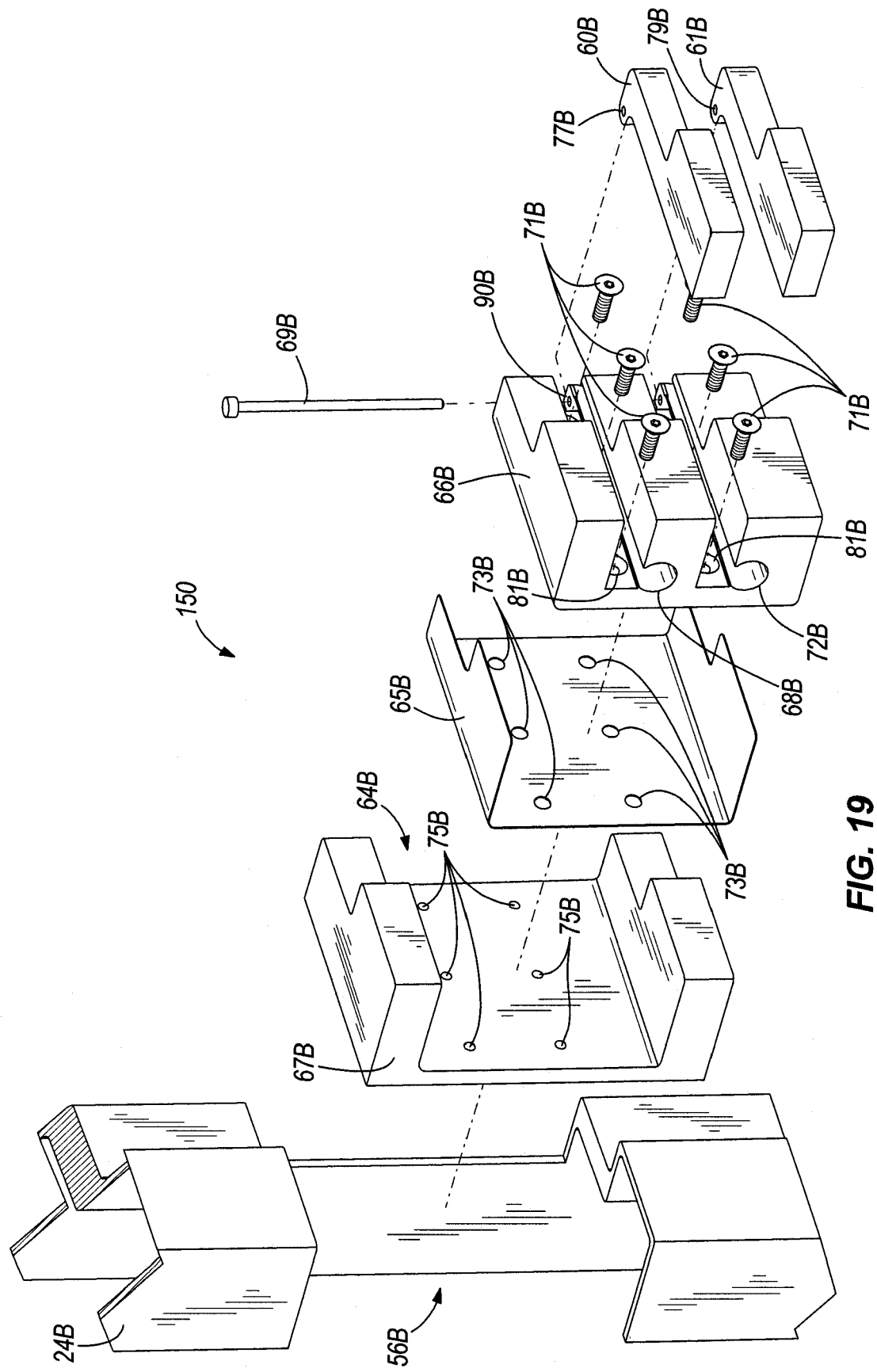
FIG. 19 is an exploded view of the waveguide of FIG. 17.
Figure 20:
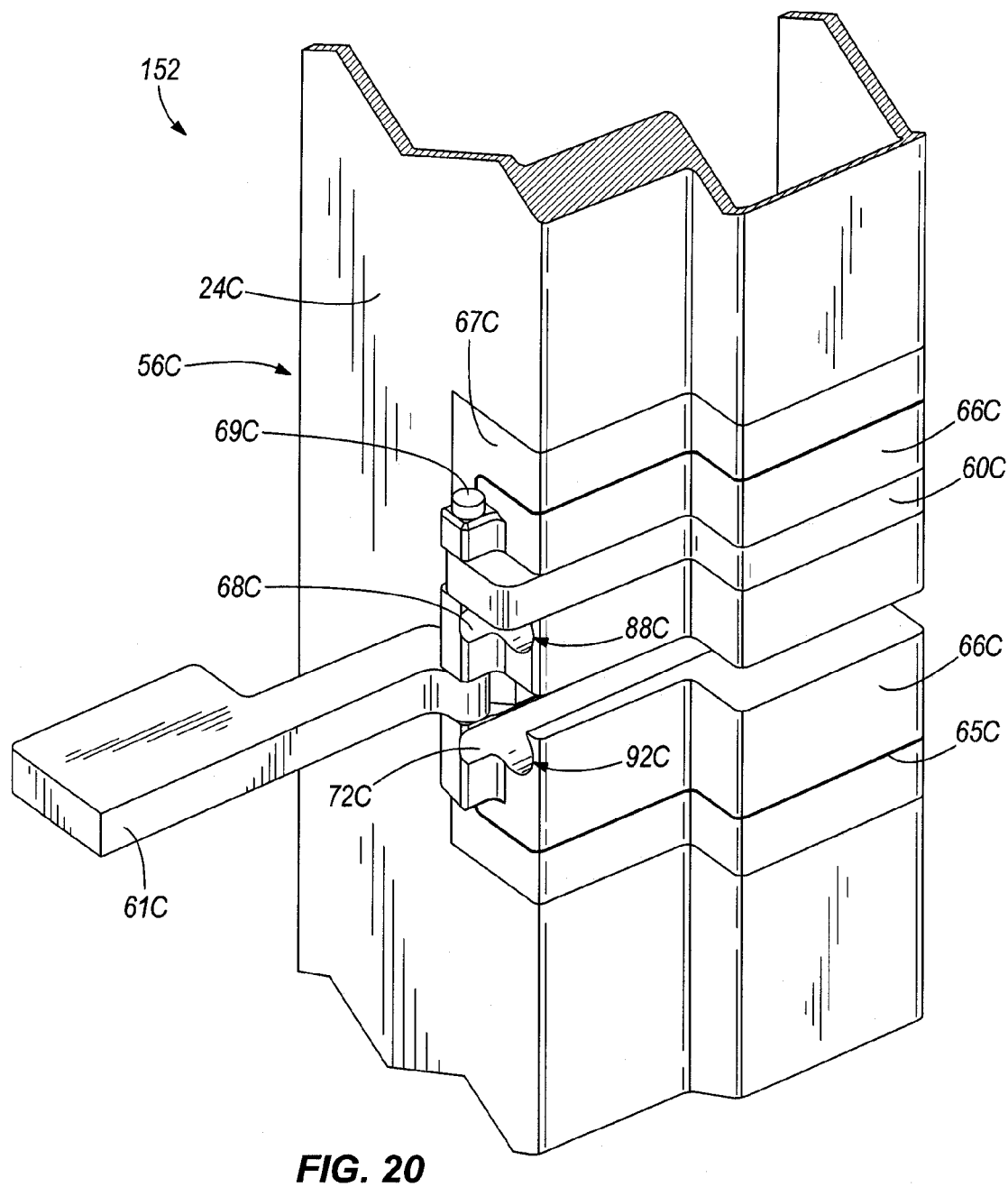
FIG. 20 is a perspective view of a waveguide similar to FIG. 18, but for a left hand door.

FIGS. 17-20 depict an eighth construction of a waveguide according to the present invention having two pivotable movable members. FIGS. 17-19 depict the eighth construction for a right hand door, whereas FIG. 20 depicts the eighth construction for a left hand door.

Referring to FIGS. 17-19, waveguide 150 includes a door frame 24B having a door frame section 56B. Door frame section 56B includes a block 67B, a bent or stamped metal support plate 65B that is received in a slot 64B of block 67B, and an insert 66B that is received in plate 65B. Insert 66B has a first recess 68B and a second recess 72B which, together with respective first movable member 60B and second movable member 61B, form first conduit retainer 88B and second conduit retainer 92B respectively (see FIG. 17). As best shown in FIG. 19, insert 66B, plate 65B, and block 67B are held together by a plurality of bolts 71B that are received in apertures 81B, 73B and 75B.

First movable member 60B and second movable member 61B have respective apertures 77B and 79B that receive a pivot pin 69B (FIG. 19). Pivot pin 69B is also received in an aperture 90B of insert 66B.

As best shown in FIG. 17, first conduit retainer 88B is formed by first recess 68B and first movable member 60B, when the movable member is disposed adjacent to the door frame section 56B. Similarly, second conduit retainer 92B is formed by second recess 72B and second movable member 61B when the second movable member is disposed adjacent to door frame section 56B. The length of each of the first and second conduit retainers 88B, 92B is at least four times greater than the maximum depth of each of the first and second conduit retainers, as discussed above in connection with the other constructions, e.g., the fifth construction in FIGS. 9-10. Likewise, the materials used in the eighth construction of FIGS. 17-20 are similar to the materials used in the other constructions discussed above.

As shown in FIG. 18, conduits 52B may be placed in or removed from the conduit retainers by pivoting the respective movable member about pivot pin 69B (FIG. 19) away from door frame section 56B. In FIG. 18, second movable member 61B has been pivoted away from the door frame, thereby enabling the operator to insert or remove a conduit. Once the conduit is in place, the second movable member can be pivoted back to its position adjacent door frame section 56B, thereby creating second conduit retainer 92B. Of course, the operation with respect to first conduit retainer 88B, first recess 68B, and first movable member 60B is similar.

Waveguide 152 depicted in FIG. 20 is substantially similar to waveguide 150 depicted in FIG. 17-19, except waveguide 152 is configured for a left hand door. As such, some of the components have been changed or re-oriented to accommodate a left hand door.

Referring to FIG. 20, door frame 24C has a door frame section 56C that includes a block 67C, and a bent or stamped metal plate 65C and an insert 66C that are received in block 67C. Block 67C, plate 65C and insert 66C are held together by bolts (not shown) in a similar manner as discussed above in connection with FIG. 19.

First and second pivotable movable members 60C and 61C, together with recesses 68C and 72C, form respective first conduit retainer 88C and second conduit retainer 92C when pivotable members 60C and 61C respectively are disposed adjacent to door frame section 56C. Likewise, pivotable members 60C and 61C may be disposed away from the door frame section to enable conduits to be either inserted or removed from the respective conduit retainers.

Other components and dimensions of the left hand door version shown in FIG. 20 are similar to those of the right hand door version depicted and described in connection with FIGS. 17-19.

Thus, the invention provides, among other things, a waveguide for a radio frequency door. Various features and advantages of the invention are set forth in the following claims.

What is claimed is:

1. A waveguide for a medical imaging room, comprising:
a door frame section having a frame inside surface, a frame outside surface, a door facing surface, and a cutout extending between the frame inside surface and the frame outside surface; and
a movable member configured to be disposed in a first position substantially within the cutout, the movable member cooperating with the door frame section to retain a conduit that passes through the door frame from the frame inside surface to the frame outside surface, and the movable member also configured to be disposed in a second position sufficiently spaced from the door frame section so that the conduit may be at least one of placed adjacent to the door frame section and removed from the waveguide;
wherein at least one of the door frame section and the movable member has a conduit retainer configured to receive the conduit, the conduit retainer including a recess.

2. The waveguide of claim 1, wherein the movable member is made from a metal alloy.

3. The waveguide of claim 1, wherein the conduit retainer has a length that is at least 3 times greater than a depth of the conduit retainer.

4. The waveguide of claim 1, wherein the conduit retainer has a length that is at least 4 times greater than a depth of the conduit retainer.

5. The waveguide of claim 1, wherein the conduit retainer is made from a metal alloy, and is configured to attenuate the passage of radio frequencies in the range of 0 to 150 Megahertz.

6. The waveguide of claim 1, wherein the conduit retainer is made from a metal alloy, and is configured to attenuate the passage of radio frequencies in the range of 0 to 750 Megahertz.

7. A waveguide for a medical imaging room, comprising:
a door frame section having a frame inside surface, a frame outside surface, a door facing surface, and a cutout extending between the frame inside surface and the frame outside surface; and
a movable member configured to be disposed in a first position substantially within the cutout, the movable member cooperating with the door frame section to retain a conduit that passes through the door frame from the frame inside surface to the frame outside surface, and the movable member also configured to be disposed in a second position sufficiently spaced from the door frame section so that the conduit may be at least one of placed adjacent to the door frame section and removed from the waveguide;
wherein each of the door frame section and the movable member has a respective recess, and wherein the recess of the door frame section is positioned in opposition to the recess of the movable member to create a conduit retainer configured to retain the conduit.

8. A waveguide for a medical imaging room, comprising:
a door frame section having a frame inside surface, a frame outside surface, a door facing surface, and a cutout extending between the frame inside surface and the frame outside surface; and
a movable member configured to be disposed in a first position substantially within the cutout, the movable member cooperating with the door frame section to retain a conduit that passes through the door frame from the frame inside surface to the frame outside surface, and the movable member also configured to be disposed in a second position sufficiently spaced from the door frame section so that the conduit may be at least one of placed adjacent to the door frame section and removed from the waveguide;
a first recess in one of the door frame section and the movable member to create a first conduit retainer; and
a second recess in one of the door frame section and the movable member to create a second conduit retainer;
wherein each of the first and second conduit retainers is configured to attenuate the passage of radio frequencies in the range of 0 to 150 Megahertz.

9. The waveguide of claim 8, wherein each of the first conduit retainer and the second conduit retainer has a respective length and a respective depth, and wherein the length of each of the conduit retainers is at least 4 times greater than its respective depth.

10. A waveguide for a medical imaging room, comprising:
a door frame section having a frame inside surface, a frame outside surface, a door facing surface, and a cutout extending between the frame inside surface and the frame outside surface; and
a movable member configured to be disposed in a first position substantially within the cutout, the movable member cooperating with the door frame section to retain a conduit that passes through the door frame from the frame inside surface to the frame outside surface, and the movable member also configured to be disposed in a second position sufficiently spaced from the door frame section so that the conduit may be at least one of placed adjacent to the door frame section and removed from the waveguide;
a first recess in the door frame section;
a second recess in the movable member disposed in opposition to the first recess such that the first and second recesses create a first conduit retainer configured to retain the first conduit.
a third recess in the door frame section; and
a fourth recess in the movable member disposed in opposition to the third recess such that the third and fourth recesses create a second conduit retainer configured to retain the second conduit.

11. The waveguide of claim 10,
wherein the first recess is in the door frame section; and
wherein the second recess is in the door frame section, disposed below the first recess.

12. A waveguide for a medical imaging room, comprising:
a door frame section having a frame inside surface, a frame outside surface, a door facing surface, and a cutout extending between the frame inside surface and the frame outside surface; and
a movable member configured to be disposed in a first position substantially within the cutout, the movable member cooperating with the door frame section to retain a conduit that passes through the door frame from the frame inside surface to the frame outside surface, and the movable member also configured to be disposed in a second position sufficiently spaced from the door frame section so that the conduit may be at least one of placed adjacent to the door frame section and removed from the waveguide; and
a connector configured to connect the door frame section to the movable member.

13. A waveguide for a medical imaging room, comprising:
a door frame section having a frame inside surface, a frame outside surface, a door facing surface, and a cutout extending between the frame inside surface and the frame outside surface; and
a movable member configured to be disposed in a first position substantially within the cutout, the movable member cooperating with the door frame section to retain a conduit that passes through the door frame from the frame inside surface to the frame outside surface, and the movable member also configured to be disposed in a second position sufficiently spaced from the door frame section so that the conduit may be at least one of placed adjacent to the door frame section and removed from the waveguide; and
wherein the door frame section further comprises a strike plate.

14. The waveguide of claim 1, further comprising:
a slot in the door frame section configured to receive the movable member.

15. The waveguide of claim 1, wherein the movable member in the first position does not extend beyond the door facing surface.

* * * * *